United States Patent
Schmidt et al.

(10) Patent No.: US 8,492,482 B2
(45) Date of Patent: *Jul. 23, 2013

(54) ACRYLIC-BASED RUBBER MODIFIED THERMOSET COMPOSITION

(75) Inventors: Scott C. Schmidt, West Chester, PA (US); Robert J. Barsotti, Drexel Hill, PA (US); Noah E. Macy, Royersford, PA (US); Rabi Inoubli, Pau (FR); Pierre Gerard, Denguin (FR)

(73) Assignee: Arkema Inc., King of Prussia, PA (US)

( * ) Notice: Subject to any disclaimer, the term of this patent is extended or adjusted under 35 U.S.C. 154(b) by 353 days.

This patent is subject to a terminal disclaimer.

(21) Appl. No.: 12/747,017

(22) PCT Filed: Nov. 26, 2008

(86) PCT No.: PCT/US2008/084770
§ 371 (c)(1),
(2), (4) Date: Jun. 9, 2010

(87) PCT Pub. No.: WO2009/076069
PCT Pub. Date: Jun. 18, 2009

(65) Prior Publication Data
US 2010/0273958 A1    Oct. 28, 2010

Related U.S. Application Data

(60) Provisional application No. 61/012,571, filed on Dec. 10, 2007.

(51) Int. Cl.
*C08F 265/02* (2006.01)
*C08F 265/06* (2006.01)
*C08F 265/10* (2006.01)

(52) U.S. Cl.
USPC ........ 525/92 H; 525/88; 525/92 C; 525/92 F; 525/296; 525/299

(58) Field of Classification Search
None
See application file for complete search history.

(56) References Cited

U.S. PATENT DOCUMENTS

| 7,745,535 | B2 * | 6/2010 | Schmidt et al. | 525/89 |
| 2003/0190467 | A1 | 10/2003 | Husemann et al. | |
| 2004/0034124 | A1 | 2/2004 | Court et al. | |
| 2004/0247881 | A1 * | 12/2004 | Dean et al. | 428/413 |
| 2006/0063891 | A1 | 3/2006 | Ruzette et al. | |
| 2008/0051511 | A1 | 2/2008 | Guerret et al. | |
| 2008/0188626 | A1 | 8/2008 | Verghese et al. | |
| 2008/0213489 | A1 | 9/2008 | Verghese et al. | |
| 2008/0287595 | A1 | 11/2008 | Verghese et al. | |
| 2009/0270559 | A1 * | 10/2009 | Schmidt et al. | 525/222 |
| 2011/0301298 | A1 * | 12/2011 | Schmidt et al. | 525/299 |

FOREIGN PATENT DOCUMENTS

| JP | 2006-335996 A | * 12/2006 |
| JP | 2006335996 | 12/2006 |
| WO | WO 2006/077153 A2 | * 7/2006 |

OTHER PUBLICATIONS

Grubbs, Robert B., et al., "Methacrylic Block Copolymers through Metal-Mediated Living Free Radical Polymerization for Modification of Thermosetting Epoxy", Macromolecules, 2001, 34, p. 8593-8595.

Thio, Yonathan S., et al., "Epoxy Toughening Using Low Molecular Weight Poly(hexylene oxide)-Poly(ethylene oxide) Diblock Copolymers", Macromolecules, 2006, 39, p. 7187-7189.

Grubbs, Robert B., et al., "Reactive Block Copolymers for Modification of Thermosetting Epoxy", Macromolecules, 2000, 33, p. 9522-9534.

Ruzette, Anne-Valerie, et al., "Block Copolymers in Tomorrow's Plastics", Nature materials, Jan. 2005, vol. 4, p. 19-32.

* cited by examiner

*Primary Examiner* — Robert Sellers
(74) *Attorney, Agent, or Firm* — Thomas F. Roland

(57) ABSTRACT

The invention relates to a liquid rubber acrylic block copolymer, and its use in modifying a thermoset composition. The liquid rubber acrylic block copolymer adds toughness and flexibility to a thermoset composition. The acrylic block copolymers are especially useful for modifying epoxy compositions.

14 Claims, 1 Drawing Sheet

Data type   Height
Z range     50.00 nm

Data type   Phase
Z range     40.00°

Data type   Height
Z range     200.0 nm

Data type   Phase
Z range     90.00°

ACRYLIC-BASED RUBBER MODIFIED THERMOSET COMPOSITION

FIELD OF THE INVENTION

The invention relates to a liquid rubber acrylic block copolymer, and its use in modifying a thermoset composition. The liquid rubber acrylic block copolymer adds toughness and/or flexibility to a thermoset composition. The acrylic block copolymers are especially useful for modifying epoxy compositions.

BACKGROUND OF THE INVENTION

Epoxy resins are a class of thermosetting polymers widely used in structural adhesives, composites, surface coatings, and laminates due to their high strength, low creep, low cure shrinkage, resistance to corrosion, and excellent adhesion. A major shortcoming is the inherent brittle nature of the epoxies in the cured state, which inhibits various industrial applications. A well-known method employed to toughen brittle polymers is to incorporate a discrete phase of rubber particles into a rigid polymer matrix. A well-established factor responsible for the final mechanical properties of these hybrid materials, aside from the intrinsic properties of the composite materials themselves, is the resultant morphology of the material. Control over this morphology is critical for the fabrication of modified toughened epoxy composites with target end-use properties. One effective technique is to add a component capable of phase separation such as, a reactive liquid rubber or amphiphilic block copolymer. Traditional core-shell additives have also been used with limited success due to problems with dispersion efficiency. Another drawback of the core-shell additives is that they render the thermoset opaque (loss of transparency).

One well-known approach to toughened epoxy resins is through blending with a reactive "liquid rubber". One commonly utilized material is a carboxyl-terminated copolymer of butadiene and acrylonitrile (CTBN). One benefit of these polymers is the ease of blending and minimal effect on viscosity due to the miscibility with the epoxy resin and the low glass transition temperature (Tg) nature of the material. The reactive CTBN polymers, when cured with an epoxy resin, increase in molecular weight, which in combination with the increasing resin molecular weight leads to a decrease in solubility of the rubber in the resin. The decreased solubility results in rubber phase separation. This separation results in discrete rubber particles covalently bound to the epoxy matrix. Unfortunately, incomplete phase separation leads to an undesirable reduction in the matrix Tg. Furthermore, the resultant phase separated morphology and thus the subsequent composite properties are not well controlled and are highly dependant on the cure system and cure profile. Lastly, CTBN contains a high level of unsaturation, which may lead to undesirable degradation and cross-linking reactions (especially at elevated temperatures) and they potentially contain trace carcinogenic free acrylonitrile. These deficiencies may be avoided with the acrylate system of the present invention.

A second approach to toughened epoxy resins is through amphiphilic block copolymers (epoxy miscible segment and epoxy immiscible segment) containing a rubbery component. These block copolymers are thought to toughen epoxy resins through the self-assembly of the amphiphilic block, which occurs prior to epoxy cure.

US2004/0034124 describes the use of amphiphilic block copolymers to toughen epoxy thermosets. Specifically claimed is the use of amphiphilic block copolymers containing PMMA. These block copolymers are shown to pre-assemble prior to the thermoset cure, thus enable toughening without compromising the resultant thermoset Tg. This provides benefit over the aforementioned CTBN type systems. The amphiphilic nature, coupled with the high Tg of the PMMA block imparts a significant viscosity increase in the pre-cured blend, which can be detrimental for many applications. Furthermore process difficulties can be encountered, as the dissolution of the PMMA block copolymer in the thermoset resin must be carried out at elevated temperatures. Also, the PMMA block while providing compatibility with the epoxy resin, does not contribute to the rubber toughening properties, or the effective rubber toughening efficiency is not optimal.

WO 2006/052727 is analogous to the abovementioned patent, but in place of PMMA it describes polyethyleneoxide (PEO)-based amphiphilic block copolymers having at least one polyether structure, for use as epoxy resin additives. These amphiphilic polyether blocks, at a use level of 1-10 weight percent on the epoxy resin, form nano-scale (15-25 nm) domains due to self-assembly (form into micellar structures in the cured epoxy system). One problem with PEO systems is that the PEO, while having a low Tg, is still crystalline (crystalline PEO homopolymers have a melting temperature (Tm)≈60° C.). The crystalline nature can affect the block copolymer ordering, reduce the effective rubber toughening efficiency, and process difficulties can be encountered, as the dissolution of the PEO block copolymer in the thermoset resin may need to be carried out at elevated temperatures. Also, PEO is water-soluble and readily absorbs moisture and care must be taken to limit moisture in epoxy cure applications as water has detrimental effects on the epoxy matrix Tg (significant reduction).

Furthermore, PEO-based block copolymers are produced using living anionic polymerization techniques. Living anionic polymerization suffers from several drawbacks, such as, poor copolymerization between polar and non-polar comonomers and the inability to use monomers that can be easily deprotonated. Therefore functional monomers cannot be directly incorporated and the copolymerization of monomer mixtures can be problematic and/or non-viable. This reduces the ability to tailor properties such as solubility, reactivity, and Tg. Furthermore, this process can be expensive, difficult or impractical to carry out on an industrial scale as bulk or emulsion techniques cannot be used, extremely pure reagents are necessary (even trace amounts of protic material inhibits polymerization), and an inert atmosphere is requisite. Lastly, the significance of tailoring block composition or allowing for the formation of gradient compositions to control solubility and final morphology are not taught.

WO 2006/052727 further describes other useful analogous amphiphilic block copolymers such as reactive poly(epoxyisoprene)-b-polybutadiene. Aside from the aforementioned limitations above, these types of structures are identified as complicated to prepare, requiring multiple steps, and therefore economically unattractive limiting application use. Furthermore, they have disadvantages due to a high level of unsaturation, which may lead to undesirable degradation and cross-linking reactions (especially at elevated temperatures).

Similar self-assembling amphiphilic block copolymers of poly(ethylene oxide)-b-poly(propylene oxide) for use in epoxy resin modification are also known (Macromolecules, 2000, 33, 5235-5244.)

US 2004/0247881 describes the use of an amphiphilic block copolymer as an epoxy modifier for a specific class of flame retardant epoxy resin. Examples are given of polyether-based block copolymers and of reactive poly(methyl methacrylate-co-glycidyl methacrylate)-b-poly(2-ethylhexylmethacrylate). Disadvantages of these types (High Tg and PEO-based) of block copolymers have been disclosed in the abovementioned text. US 2004/0247881 also mentions the possible use of low Tg methacrylic based block copolymers, but does not disclose the use or any benefits thereof.

Aside from the aforementioned limitations, none of these disclosures teach the significance of acrylic block copolymers containing all low Tg segments or the benefit of tailoring the two blocks through copolymerization or gradient block structures to control solubility and final morphology, which thereby control the resultant thermoset end-use properties.

Surprisingly, it has now been found that all low Tg ("liquid rubber" type) acrylic-based block polymers, either functionalized or unfunctionalized can be used to effectively modify thermoset resins and furthermore can be easily prepared and tailored to provide the desired modification. The acrylic-based block copolymers contain low Tg segments, rendering them easy to blend and use in current manufacturing processes, and providing toughness and/or flexibility to the thermoset resins. The acrylic block polymer is especially useful in modifying epoxy resins. The acrylic block polymers of the invention incorporate the advantages of "liquid rubbers" and block copolymers into the same material, providing a "liquid-rubber" type acrylic block copolymer. Furthermore, the process to make these materials is simple and cost effective and allows one the ability to readily tailor the polymer properties, such as Tg and solubility, through copolymerization and gradient structures. This tailoring allows one to control the final properties of the thermoset material.

SUMMARY OF THE INVENTION

The invention relates to a block copolymer having all low Tg acrylic blocks, with at least one of the low Tg acrylic blocks being a thermoset compatible block.

The invention also relates to a thermoset composition having a thermoset matrix having dispersed therein a block copolymer having all low Tg acrylic blocks, with at least one of the low Tg acrylic blocks being a thermoset compatible block

DETAILED DESCRIPTION OF THE INVENTION

Figure 1:
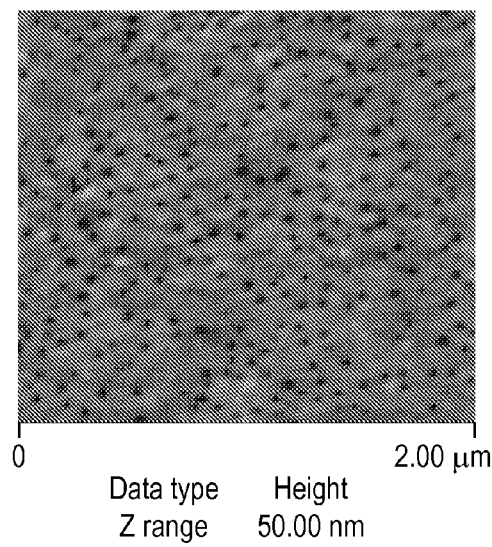
FIGS. 1 and 2: Are Atomic Force Microscopy (AFM) micrographs of a modified epoxy (Example 25), showing discrete particle morphology.

The invention relates to thermoset compositions that contain all low Tg acrylic-based block polymers that add toughness and/or flexibility to the thermoset material and in particular for epoxy material.

By "block copolymer" as used herein means di-blocks, tri-blocks, or multiblocks, graft block copolymers, branched block copolymers (also known as linear star polymers), as will be evident to those skilled in the art. Also included by "block copolymer" as used herein are gradient polymers or gradient block copolymers. Gradient polymers are linear or branched polymers made by a controlled polymerization process whose composition changes along the polymer chains, potentially ranging from a random to a block-like structure.

When a copolymer segment is synthesized using a controlled radical polymerization (CRP) technique such as nitroxide-mediated polymerization, it is often termed a gradient or 'profiled' copolymer. This type of copolymer is different than a polymer obtained by a traditional free radical process and will be dependant on the monomer composition, control agent, and polymerization conditions. For example, when polymerizing a monomer mix by traditional free radical polymerizations, a statistical copolymer is produced, as the composition of the monomer mix remains static over the lifetime of the growing chain (approximately 1 second). Furthermore, due to the constant production of free radicals throughout the reaction, the composition of the chains will be non-uniform as monomer concentration will fluctuate. During a controlled radical polymerization the chains remain active throughout the polymerization, thus the composition is uniform and is dependant on the corresponding monomer mix with respect to the reaction time. Thus in a two monomer system where one monomer reacts faster than the other, the distribution or 'profile' of the monomer units will be such that one monomer unit is higher in concentration at one end of the polymer segment.

Each block of the block copolymers may itself be a homopolymer, a copolymer (where copolymer includes terpolymer and other combinations of two or more different monomers), or a gradient polymer. Gradient block copolymers can be formed for example by allowing unreacted monomer from a $1^{st}$ block to continue to react in the formation of a second block. Thus in an A-B block gradient copolymer, the A block is formed first. When the monomer(s) for the B block are added, the unreacted A block monomer(s) is kept in the mixture to react leading to an A-B block copolymer with a gradient of the A block in the B block. Preferred block polymers are A-B diblock and A-B-A triblock copolymers.

By "all low Tg" acrylic block polymers, as used herein, means that the acrylic block polymers of the invention are those in which all polymer blocks have a Tg below 50° C., preferably below 40° C., more preferably below 35° C., and even more preferably below 25° C. Furthermore, these polymers are non-crystalline.

By "acrylic block polymers", as used herein, is meant that each block of the polymer contains at least 5 mole percent of acrylic monomer units, preferably at least 25 mole percent acrylic monomer units, more preferably at least 50 mole percent acrylic monomer units, and even more preferably at least 70 mole percent acrylic monomer units. In one embodiment, the acrylic block polymer may contain 100 percent acrylic monomer units.

By "acrylic" block polymer, as used herein, is meant monomer units of acrylate monomers including acrylic acid, salts, esters, anhydrides and amides thereof, and mixtures thereof as will be known to those skilled in the art. The salts can be derived from any of the common metal, ammonium, or substituted ammonium counter ions, such as sodium, potassium, ammonium, and tetramethyl ammonium. The esters can be derived from $C_{1-40}$ straight chain, $C_{3-40}$ branched chain, or $C_{3-40}$ carbocyclic alcohols; from polyhydric alcohols having from about 2 to about 8 carbon atoms and from about 2 to about 8 hydroxyl groups, such as ethylene glycol, propylene glycol, butylene glycol, hexylene glycol, glycerin, and 1,2,6-hexanetriol; from amino alcohols, such as aminoethanol, dimethylaminoethanol and diethylaminoethanol and their quaternized derivatives); or from alcohol ethers, such as methoxyethanol and ethoxyethanol. Typical esters include, for example, methyl acrylate, ethyl acrylate, n-propyl acrylate, n-butyl acrylate, iso-butyl acrylate, t-butyl acrylate, 2-ethylhexyl acrylate, octyl acrylate, decyl acrylate and mixtures thereof. Typical hydroxyl or alkoxy containing monomers include, for example, 2-hydroxyethyl acrylate, hydroxypropyl acrylate, glyceryl monoacrylate, 3-hydroxypropyl acrylate, 2,3-dihydroxypropyl acrylate, 2-methoxyethyl acrylate, 2-ethoxyethyl acrylate, polyethyleneglycol acrylate and mixtures thereof. The amides can be unsubstituted, N-alkyl or N-alkylamino mono-substituted, or N,N-dialkyl, or N,N-dialkylamino disubstituted, in which the alkyl or alkylamino groups can be $C_{1-40}$ (preferably $C_{1-10}$) straight chain, $C_{3-40}$ branched chain, or $C_{3-40}$ carbocyclic groups. In addition, the alkylamino groups can be quaternized. Typical amides include, for example, acrylamide, N-methyl acrylamide, N,N-dimethyl acrylamide, N,N-di-n-butyl acrylamide, N-t-butyl acrylamide, N-phenyl acrylamide, N,N-dimethylaminoethyl acrylamide.

The acrylic polymer may contain up to 95 mole percent of one or more ethylenically unsaturated non-acrylic monomers, including but not limited to styrene, alpha-methyl styrene, polymerizable dienes, vinyl compounds, vinylidene fluorides, vinylidene chlorides, vinyl sulfone, vinyl sulfides, vinyl ethers, and vinyl sulfoxides. Typical vinyl compounds include, for example, vinyl acetate, vinyl butyrate, vinyl pyrrolidone, vinyl imidazole, methyl vinyl ether, methyl vinyl ketone, vinyl pyridine, vinyl pyridine-N-oxide, vinyl furan, vinyl caprolactam, vinyl acetamide, and vinyl formamide. Typical polymerizable dienes include, for example, butadiene and isoprene. Methacrylic monomers may also be used. By "methacrylic", as used herein, is meant monomer units of methacrylate monomers including methacrylic acid, salts, esters, anhydrides and amides thereof, and mixtures thereof as will be known to those skilled in the art. The salts can be derived from any of the common metal, ammonium, or substituted ammonium counter ions, such as sodium, potassium, ammonium, and tetramethyl ammonium. The esters can be derived from $C_{1-40}$ straight chain, $C_{3-40}$ branched chain, or $C_{3-40}$ carbocyclic alcohols; from polyhydric alcohols having from about 2 to about 8 carbon atoms and from about 2 to about 8 hydroxyl groups, such as ethylene glycol, propylene glycol, butylene glycol, hexylene glycol, glycerin, and 1,2,6-hexanetriol; from amino alcohols, such as aminoethanol, dimethylaminoethanol and diethylaminoethanol and their quaternized derivatives); or from alcohol ethers, such as methoxyethanol and ethoxyethanol. Typical esters include, for example, methyl methacrylate, ethyl methacrylate, n-propyl methacrylate, n-butyl methacrylate, iso-butyl methacrylate, t-butyl methacrylate, 2-ethylhexylmethacrylate, octyl methacrylate, decyl methacrylate and mixtures thereof. Typical hydroxyl or alkoxy containing monomers include, for example, 2-hydroxyethyl methacrylate, hydroxypropyl methacrylate, glycerol monomethacrylate, 3-hydroxypropyl methacrylate, 2,3-dihydroxypropyl methacrylate, 2-methoxyethyl methacrylate, 2-ethoxyethyl methacrylate, polyethyleneglycol methacrylate and mixtures thereof. The amides can be unsubstituted, N-alkyl or N-alkylamino mono-substituted, or N,N-dialkyl, or N,N-dialkylamino disubstituted, in which the alkyl or alkylamino groups can be $C_{1-40}$ (preferably $C_{1-10}$) straight chain, $C_{3-40}$ branched chain, or $C_{3-40}$ carbocyclic groups. In addition, the alkylamino groups can be quaternized. Typical amides include, for example, methacrylamide, N-methyl methacrylamide, N,N-dimethyl methacrylamide, N,N-di-n-butyl methacrylamide, N-t-butyl methacrylamide, N-phenyl methacrylamide, N,N-dimethylaminoethyl methacrylamide.

Acrylic Block Polymers

Differing from the traditional "pure" block copolymers where each segment contains 1 monomer type, it has been discovered that combining the favorable characteristics of profiled copolymers with the desirable properties of block copolymers leads to materials having advantageous end-use properties by tailoring the monomer composition and sequencing. The use of profiled or gradient block structures allows the final polymer properties to be tuned based on application needs. For example, the properties attained in traditional copolymers are typically an average of the properties imparted by the resultant monomers incorporated, while block copolymers lead to a composite material containing the characteristic properties inherent to each parent polymer block segment. The incorporation of a profiled segment, allows for the tuning of each block segment and sometimes can further simplify the polymer synthesis process. While not meant to be limiting, one example is tailoring a segment's glass transition temperature (Tg) e.g., by incorporating a low Tg monomer in a high Tg polymer segment, which allows for an overall reduction of the segment Tg. A second example is reducing the hydrophilicity of a segment by incorporating a hydrophobic comonomer.

An important feature of the present invention is that the composition, phase segregation strength, Tg, and subsequent solubility of the all low Tg block copolymers can be readily tailored through variations of comonomer amounts and gradient type structures. This tailoring allows for the control over a wide range of physical and mechanical properties in the pre-cured and final cured thermoset, such as, (modulus, strength/impact, thermoset Tg, viscosity, dissolution temp, etc.

The block acrylic polymers contain at least one block, which is compatible with the thermoset resin, such as polymethyl acrylate or polymethyl acrylate-co-N,N dimethylacrylamide or polymethyl acrylate-co-acrylic acid or polymethyl acrylate-co-polyethyleneglycol methacrylate, or polybutyl acrylate-co-N,N dimethylacrylamide or polybutyl acrylate-co-polyethyleneglycol methacrylate. The other block segments of the disclosed acrylic polymers can be compatible, incompatible or partially compatible. Surprisingly, in the case of amphiphilic block copolymers (epoxy miscible segment and epoxy immiscible segment), the incorporation of epoxy miscible monomers into the epoxy immiscible segment and/or epoxy immiscible monomers into the epoxy miscible segment has been shown to impart control over several pre-cure and post cure properties.

The mixing of epoxy miscible monomers and epoxy immiscible monomers into a block segment offers a method of controlling the solubility and the level of phase segregation prior to epoxy cure. Another example is the incorporation of epoxy miscible monomers into the epoxy immiscible segment allowing for ease of dissolution into the epoxy resin and to a decrease in the solution viscosity aiding in processing and use. For example, while polybutyl acrylate (PBA) is not miscible in epoxy resins, a copolymer of PBA with high enough levels of N,N dimethylacrylamide (DMA) is soluble. By tailoring the amount of the DMA in the PBA segment, one can have a segment ranging from completely insoluble to completely soluble in the epoxy resin. This will affect the viscosity of the pre-cured epoxy resin and also affect the morphology and resultant end-use properties. For example, in an AB block copolymer with a PBA epoxy immiscible B segment, by the use of an epoxy miscible block, which is 50% dimethyl acrylamide (DMA, miscible in epoxy) and 50% polybutyl acrylate (PBA, not miscible in epoxy), a K1C (a measurement of toughness and the ability to resist crack propagation) of 1.69 is achieved. Using the same polymer with only 20% DMA and 80% PBA in the epoxy miscible block, a K1C of only 1.04 is achieved.

Even the use of a highly epoxy miscible block (DMA) with another epoxy miscible block (polymethyl acrylate) can improve morphology and toughening. For example, the addition of 10% of DMA to the PMA block of a 20 k PMA-b-30 k PBA diblock copolymer changes the structure from a continuos phase morphology to a discrete nanospherical morphology and improves K1C from 1.21 to 1.54 (see examples 1 and 2). By continuous phase is meant that in the epoxy matrix, the additive phase can be traced for at least 5 microns and has an aspect ration of greater than 10. This does not include large (greater than 1 micron) rubber particles, worm-like micelles or wormlike vesicles.

The Tg of the resultant segments can also be tailored by combining monomers that when polymerized resulted in glass transition temperatures that are intermediate between the Tg's of the analogous respective homopolymers (i.e., the Tg of a copolymer of monomers A and B will be intermediate to the Tg of a homopolymer of A and B respectively). Thus, while poly(DMA) is epoxy soluble, the Tg of the material is >50° C., thus it can lead to processing issues. However copolymerizing DMA with a low Tg monomer such as BA will allow for solubility and low Tg.

While not being bound to any specific theory, it has been shown that control over the polymer composition and architecture can influence the final morphology and thus the resultant end-use properties. For example, the use of a 20 k PMA/DMA-b-30 k PBA gives a K1C of 1.54 while the use of a more asymmetric block copolymer (20 k PMA/DMA-block-60 k PBA) gives a lower K1C of 1.42. The flexibility of the epoxy can also be affected by asymmetry; a 20 k PMA-b-30K PBA gives a flexural modulus of 1109 MPa; a 20 k PMA-b-50 k PBA gives a flexural modulus of 605 MPa and a 10 k PMA-b-50 k PBA gives a flexural modulus of 190 MPa Therefore an important benefit of the disclosed invention is the ease in which the specific composition and architecture of the corresponding block copolymers can be tailored accordingly based on the intended thermoset resin formulation utilized, to attain the desired morphological behavior and process characteristics.

The acrylic block copolymers of the invention are formed by a controlled radical polymerization process. Examples of controlled radical polymerization techniques will be evident to those skilled in the art, and include, but are not limited to, atom transfer radical polymerization (ATRP), reversible addition fragmentation chain transfer polymerization (RAFT), nitroxide-mediated polymerization (NMP), boron-mediated polymerization, and catalytic chain transfer polymerization (CCT). Descriptions and comparisons of these types of polymerizations are described in the ACS Symposium Series 768 entitled *Controlled/Living Radical Polymerization: Progress in ATRP, NMP, and RAFT*, edited by Krzystof Matyjaszewski, American Chemical Society, Washington, D.C., 2000.

In principle, any living or controlled polymerization technique, compatible with the monomer choices, can be utilized to make the block copolymer. One preferred method of controlled radical polymerization is nitroxide-mediated CRP. Nitroxide-mediated CRP is preferred as it allows for the use of a larger variety of monomers in the triblock copolymer, including the use of acrylics, acrylamides, and especially acid functional acrylics.

Nitroxide-mediated polymerization can occur in bulk, solvent, and aqueous polymerization media, and can be used in existing equipment at reaction times and temperature similar to other free radical polymerizations. One advantage of nitroxide-mediated CRP is that the nitroxide is generally innocuous and can remain in the reaction mix, while other CRP techniques often require the removal of the control compounds from the final polymer. Furthermore, stringent purification of the reagents is not needed.

The mechanism for this control may be represented diagrammatically as below:

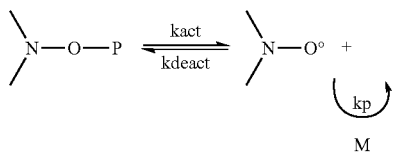

with M representing a polymerizable monomer and P representing the growing polymer chain.

The key to the control is associated with the constants $K_{deact}$, $k_{act}$ and $k_p$ (T. Fukuda and A. Goto, Macromolecules 1999, 32, pages 618 to 623). If the ratio $k_{deact}/k_{act}$ is too high, the polymerization is blocked, whereas when the ratio $k_p/k_{deact}$ is too high or when the ratio $k_{deact}/k_{act}$ is too low though, the polymerization is uncontrolled.

It has been found (P. Tordo et al., Polym. Prep. 1997, 38, pages 729 and 730; and C. J. Hawker et al., Polym. mater. Sci. Eng., 1999, 80, pages 90 and 91) that β-substituted alkoxyamines make it possible to initiate and control efficiently the polymerization of several types of monomers, whereas TEMPO-based alkoxyamines [such as (2',2',6',6'-tetramethyl-1'-piperidyloxy)methylbenzene mentioned in Macromolecules 1996, 29, pages 5245-5254] control only the polymerizations of styrene and styrenic derivatives. TEMPO and TEMPO-based alkoxyamines are not suited to the controlled polymerization of acrylics.

The nitroxide-mediated CRP process is described in, U.S. Pat. No. 6,255,448, US 2002/0040117 and WO 00/71501, incorporated herein by reference. The above-stated patents describe the nitroxide-mediated polymerization by a variety of processes. Each of these processes can be used to synthesize polymers described in the present invention.

In one process the free radical polymerization or copolymerization is carried-out under the usual conditions for the monomer or monomers under consideration, as known to those skilled in the art, with the difference being that a β-substituted stable free radical is added to the mixture. Depending on the monomer or monomers which it is desired to polymerize, it may be necessary to introduce a traditional free radical initiator into the polymerization mixture as will be evident to those skilled in the art.

Another process describes the polymerization of the monomer or monomers under consideration using a alkoxyamine obtained from β-substituted nitroxides of formula (I) wherein A represents a mono- or polyvalent structure and $R_L$ represents a mole weight of more than 15 and is a monovalent radical, and $n \geq 1$.

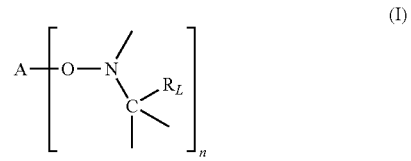

Another process describes the formation of polyvalent alkoxyamines of formula (I), based on the reaction of multifunctional monomers, such as, but not limited to, acrylate monomers and alkoxyamines at controlled temperatures. The multifunctional alkoxyamines of formula (I), wherein n≧2, may then be utilized to synthesize linear, star, and/or branched polymeric and copolymeric materials from the monomer or monomers under consideration.

Another process describes the preparation of multimodal polymers where at least one of the monomers under consideration is subjected to free radical polymerization in the presence of several alkoxyamines comprising the sequence of formula (I), wherein n is a non-zero integer and the alkoxyamines exhibit different values of n.

The alkoxyamines and nitroxyls (which nitroxyls may also be prepared by known methods separately from the corresponding alkoxyamine) as described above are well known in the art. Their synthesis is described for example in U.S. Pat. No. 6,255,448 and WO 00/40526.

One useful stable free radical is N-t-butyl-N-[1-diethylphosphono-(2,2-dimethylpropyl)]nitroxide (DEPN), which has the following structure:

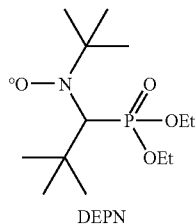

DEPN

The DEPN radical may be linked to an isobutyric acid radical or an ester or amide thereof. A useful initiator is iBA-DEPN initiator, which has the following structure, in which SG1 is the DEPN group.

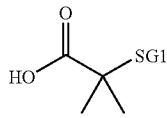

iBA-DEPN initiator when heated separates into two free radicals, one of which initiates polymerization and one of which, the SG1 nitroxide radical, reversibly terminates polymerization. The SG1 nitroxide radical dissociates from methacrylates above about 25° C. and disassociates from acrylates above about 90° C.

Other useful initiators include esters and amides of $CH_3CH(SG1)CO_2H$. If esters or amides are used, they are preferably derived from lower alkyl alcohols or amines, respectively, for example, the methyl ester, $CH_3CH(SG1)CO_2CH_3$. Polyfunctional esters, for example the diester of 1,6-hexanediol $[CH_3CH(SG1)CO_2]_2[(CH_2)_6]$, can also be used. Difunctional initiators can be used to prepare symmetrical A-B-A block copolymers. Initiators with higher functionality, for example the tetraester of pentaerythritol $[CH_3CH(SG1)CO_2CH_2]_4C]$, can be used to prepare star copolymers of the type $I(BA)_n$, in which I is the initiator and n is the functionality of the initiator.

Typically, a monofunctional alkoxyamine is used to prepare an AB block copolymer. A difunctional alkoxyamine can be used to produce a triblock ABA copolymer. However, a triblock copolymer can also be made from a monofunctional alkoxyamine by extending an AB diblock copolymer with an additional A segment (i.e., three sequential reactions of an A segment, then a B segment, then another A segment). Another method for making a triblock copolymer from a monofunctional alkoxyamine is to first react the monofunctional alkoxyamine with a diacrylate (such as butanediol diacrylate) to create a difunctional alkoxyamine. None of the reactions require the addition of further initiation source (such as an organic peroxide), though in some cases, peroxides might be used during the course of the reaction to "chase" residual monomer. If it is preferred to preserve the "living" character of the nitroxide terminated chain ends, the "chasing" step is carried out at a temperature below the nitroxide dissociation temperature as will be evident to those skilled in the art.

The copolymerization may be carried out under conditions well known to those skilled in the art, taking into account the monomers under consideration and the desired product. Thus, the polymerization or copolymerization may be performed, for example, in bulk, in solution, in emulsion or in suspension, at temperatures ranging from 0° C. to 250° C. and preferably ranging from 25° C. to 150° C.

"Sequenced" block copolymers may be produced by 1) polymerizing a monomer or a mixture of monomers in the presence of an alkoxyamine at a temperature ranging from 25° C. to 250° C. and preferably ranging from 25° C. to 150° C.; 2) allowing the temperature to fall and optionally evaporating off the residual monomer(s); 3) introducing a new monomer(s) mixture into the reaction mixture; and 4) raising the temperature to polymerize the new monomer or mixture of monomers. This process may be repeated to form additional blocks. Polymers made by this process will have some nitroxide end groups. They can remain on the end of the polymer chains or be removed by an additional processing step.

At any point during the synthesis process a further initiation source (such as an organic peroxide), might be used to create a composite material containing a mixture of controlled block structures and homopolymers. Depending on the monomer(s) present, the non-block structures could be homopolymers or random copolymers. Furthermore, these homopolymers or random copolymers may be primarily hydrophobic or hydrophilic in nature, again dependant upon the monomer(s) present.

The block co-polymers have a controlled molecular weight and molecular weight distribution. Preferably the weight average molecular weight ($M_w$) of the co-polymer is from 1,000 to 1,000,000 g/mol, and most preferably from 5,000 to 300,000 g/mol. The molecular weight distribution, as measured by the ratio of the weight average molecular weight to the number average molecular weight ($M_w/M_n$), or polydispersity, is generally less than 4.0, preferably equal to or less than 2.5, and more preferably equal to or less than 2.0 or below. Polydispersities of equal to or less than 1.5 or below, and equal to or less than 1.3 or below, may be obtained by the method of the invention.

In one preferred embodiment of the invention, the epoxy-compatible block contains from 1 to 75 mole percent of functionality and preferably from 20 to 50 mole percent functionality. This enables the functionalized block to either react with the epoxy matrix to further promote toughening or to increase compatibility of the functionalized block with the epoxy matrix (increase segregation strength). In another embodiment, at least one thermoset compatible block contains from 0.5 to 15 mol percent functionality. The functionality can be incorporated into the block polymer either through the use of functional monomers, or by post-polymerization functionalization. Useful functional groups include acids, hydroxides, acrylamides and glycidyl groups. Functional monomers useful for incorporating functional groups into the acrylic block polymer include, but are not limited to, acrylic acid, methacrylic acid, glycidal methacrylate, dimethyl acrylamide.

Examples of useful acrylic block polymers of the invention include, but are not limited to, polybutyl acrylate-block-polymethyl acrylate (PBA-b-PMA); polybutyl acrylate-block-polymethyl acrylate/acrylic acid (PBA-b-PMA/AA); polybutyl acrylate-block-polymethyl acrylate/dimethylacrylamide (PBA-b-PMA/DMA); polybutyl acrylate-block-polymethyl acrylate/polyethyleneglycol methacrylate (PBA-b-PMA/PEGM); polybutyl acrylate-block-polybutyl acrylate/polyethyleneglycol methacrylate (PBA-PBA/PEGM); polymethyl acrylate-block-polyethylhexyl acrylate (PMA-b-PEHA), polybutyl acrylate-block-polybutyl acrylate/dimethylacrylamide (PBA-b-PBA/DMA).

Thermoset Resin

The acrylic block polymer of the invention is used to modify a thermoset resin. Thermoset resins include, but are not limited to, epoxy resins, cyanoacrylates, bismaleimides, unsaturated polyester resins, polyurethanes, polyacrylics and vinyl ester resins. In one preferred embodiment, the thermoset resin is an epoxy resin.

One class of epoxy resins useful in the present invention are those having at least two oxirane functional groups, which can be polymerized by ring-opening. Preferred epoxy resins are those that are liquids at 25° C. The epoxy resins may be aliphatic, cycloaliphatic, heterocyclic or aromatic. Useful epoxy resins include, but are not limited to epoxy resins, of resorcinol diglycidyl ether, bisphenol A diglycidyl ether, triglycidyl-p-amino-phenol, bromobisphenol F diglycidyl ether, the triglycidyl ether of m-amino-phenol, tetraglycidylmethylenedianiline, the triglycidyl ether of (trihydroxy-phenyl) methane, polyglycidyl ethers of phenol-formaldehyde novolak, polyglycidyl ethers of ortho-cresol novolak and tetraglycidyl ethers of tetraphenyl-ethane. Mixtures of at least two of these resins can also be used.

Hardener

A hardener is typically used to cure the epoxy. These hardeners include those that react with epoxy at room temperature and at higher temperature. These hardeners may include but are not limited to: acid anhydrides, aromatic or aliphatic polyamines, including diaminodiphenyl sulphone (DDS), methylenedianiline, 4,4,'-methylenebis(3-chloro-2,6-diethyl-aniline (MCDEA) or 4,4'-methylenebis(2,6-diethyl-aniline (M-DEA), dicyandiamide (DICY) and its derivatives, imidazoles, polycarboxylic acids and polyphenols.

Processing

The block copolymer is incorporated into the epoxy by either dissolution in the epoxy resin or dissolution in the hardener as will be evident to those skilled in the art. Preferably, the diblock is dissolved in the epoxy resin by heating the resin and block copolymer (30° C.-160° C.) and applying a light stirring (50 rpm with a mechanical stirrer) for 5-60 minutes. Preferably, curing may be carried out immediately by incorporation of a hardener. This is accomplished by stirring at a set temperature for a set period of time depending on the nature of the hardener and resin. Incorporation of the hardener is followed immediately by curing which includes application of a certain temperature profile for a given period of time, depending on the nature of the epoxy resin and hardener. Alternatively, the resin/block copolymer solution may be cooled back to room temperature and stored for days before curing. The use of a solvent can be used in any of the abovementioned processes. A ratio of resin and hardener to block copolymer additive can vary from 99.9:0.1 to 25:75 with a range of 97.5:2.5 to 80:20 being preferred.

Properties/Uses

The acrylic block polymer additive of the invention provides toughening and/or flexibility to the thermoset composition. The acrylic block polymers are soluble or dispersible in the base epoxy resin leading to an initially homogeneous or dispersed solution respectively. The liquid acrylic-based block polymers are easy to disperse, and the solubility in the thermoset can be adjusted to maximize solubility/dispersion. This can be done by modifying the solubility and/or functionality of the block polymer through choice of monomer composition and block size.

As the curing progresses the molecular weight of the epoxy increases and phase separation occurs leading to the formation of a nano- or microphase separated morphology (dependant on cure kinetics and blend compatibility). Depending on the polymer design, the phase separated morphology can set prior to curing (strongly segregated block copolymers), thus eliminating the dependence on cure kinetics to induce the necessary phase separation. Therefore self-assembly into ordered and disordered phases, on a nanometer length-scale, will occur prior to epoxy cure, rather than phase separating during the cure.

While not being bound to any theory, it is suspected that strongly segregated block copolymers will fully separate prior to initial cure, while those more weakly segregated will separate as the curing progresses. The segregation strength and hence phase separation is primarily controlled by the block type, e.g., solubility, composition, etc.

The acrylic block copolymer/epoxy systems of the present invention exhibit excellent fracture properties as the dispersed rubber phase act to dissipate the fracture energy. This can be most clearly seen by the measurement of K1C, the stress intensity factor that measures the ability of a crack to propagates through the thermoset resin or G1C, a measurement of the energy required for crack propagation. A second key advantage is a low drop in the Tg of the epoxy resin (preferably less than 10° C.), allowing for the toughened epoxy to still be used for high temperature applications.

Additional advantages of thermoset compositions containing the acrylic block copolymer of the invention include:
  Ability to control rubber domain shape and size.
  Ability to maintain or decrease modulus depending on monomer composition and block length selection.
  The entire polymer is a rubber (low Tg) thus can get higher rubber content at lower polymer loadings.
  Improved aesthetics and stability of the modified composition.
  The entire polymer is low Tg, lending to ease of processability (readily dissolves in the epoxy resin at low temperatures)
  Structure can be readily tailored to alleviate viscosity constraints.

EXAMPLES

The controlled architecture amphiphilic block copolymers were synthesized using the following generic protocol. Molecular weights were targeted by manipulating the monomer to initiator concentration ([M]/[I]). Therefore a targeted molecular weight could be achieved by setting the [M]/[I] ratio, and then carrying out the polymerization to the desired conversion necessary to reach the target molecular weight. Monomer conversion was conveniently monitored by gas chromatography (GC) analysis or flash devolitization of the unreacted monomer under vacuum. The polymer examples were run neat or in solution. Typical solvents used included, dioxane, n-methylpyrrolidinone, dimethylacetamide, dimethylformamide, tert-butyl alcohol, n-butyl alcohol, toluene, ethyl benzene, acetone, methyl acetate, ethyl acetate, propyl acetate, butyl acetate, ethanol, cyclohexanone, cyclopentanone and methyl ethyl ketone. Polymerizations were carried out at ambient pressures or run under nitrogen pressure up to 60 psi. Polymerizations were run in standard polymerization vessels both with and without shearing capacity, although adequate mixing capabilities were preferred.

As a general procedure, specific diblock copolymer compositions are prepared by various traditional monomer addition and polymer isolation protocols, as generically described below and evident to those skilled in the art, dependant on the desired final block composition.

For example, a pure block copolymer is prepared by isolating the pure 1st block by precipitation techniques or by evaporating the residual monomer upon completion of the first block synthesis, followed by the addition of a second monomer composition different from the first. This second monomer composition then undergoes polymerization.

Profiled block copolymers were synthesized by polymerizing a mixture of two or more monomers. This mixture could result, for instance, by adding a second monomer to the initial polymerization medium prior to evaporation of the residual first monomer, or a multi-monomer mix could be polymerized as a first block, or a multi-monomer mix could be added to an isolated pure first block.

Pure gradients were formed from a mix of monomers in which one or more monomers reacts much faster than the other(s). The resultant gradient polymer will contain the reactive monomer heavily concentrated at one end of the polymer chain.

Gradient block copolymers were formed by allowing unreacted monomer from a $1^{st}$ block to continue to react in the formation of a second block. Thus in an A-B block gradient copolymer, the A block is formed first. When the monomer(s) for the B block are added, the unreacted A block monomer(s) is kept in the mixture to react leading to an A-B block copolymer with a gradient of the A block in the B block.

Block copolymer/homopolymer blends were prepared by employing well known chasing techniques. For example, a first block is synthesized by polymerizing a monomer or monomer mix to a desired conversion (less than 100%). The reaction mixture is then cooled to a temperature where the nitroxide is stable at which time a secondary initiation source, such as organic peroxide, is added to carry out the uncontrolled polymerization of the residual $1^{st}$ block monomers. After the chasing step is complete, the $2^{nd}$ block monomer(s) can be added and the temperature increased to allow for the activation of the nitroxide end groups, which subsequently leads to the formation of a block copolymer. The composite material will be comprised of both the chased homopolymer (similar in nature to the $1^{st}$ block) and a block copolymer. The chasing step can be carried out again with the $2^{nd}$ block or can be used in place of the $1^{st}$ block chase.

The synthesis of the copolymers of the invention as described above are further illustrated by reference to 3 polymerization methods (a, b, and c) and the corresponding specific polymer examples listed below. Other copolymers of this invention can be prepared in an analogous manner, as it will be evident to those skilled in the art.

TABLE 1

| Example | Block A | Block B | Mn A (kg/mol) | Mn B (kg/mol) | Comments |
|---|---|---|---|---|---|
| "Pure" Block Copolymers (<5% gradient) - monomer removed before $2^{nd}$ block | | | | | |
| 1 | MA | BA | 4.9 | 7.9 | |
| 2 | MA | BA | 4.9 | 10.5 | |
| 3 | MA | BA | 18.5 | 30 | |
| 4 | MA/5% AA | BA | 19.1 | 59.0 | |
| 5 | MA/5% AA | BA | 19.1 | 59.0 | With 1% stabilizer added |
| 6 | MA/5% AA | BA | 20.0 | 52.5 | |
| 7 | MA | BA | 11.4 | 49.5 | |
| 8 | MA | BA | 18.5 | 52.9 | |
| 9 | MA/28% PEGM | BA | NM | NM | |
| Gradient Diblock Copolymers (>5% gradient) - $1^{st}$ block monomer left in or added to $2^{nd}$ block | | | | | |
| 10 | MA | BA/20% MA | 18.5 | 46.1 | |
| 11 | BA/28% PEGM | BA | NM | NM | |
| 12 | MA/10% DMA | BA/9% MA | 20 | 30 | |
| 13 | BA | DMA/75% BA | 25.0 | 26.6 | |
| 14 | BA | DMA/50% BA | 33.3 | 4.0 | |
| 15 | BA | DMA/80% BA | 33.3 | 14.4 | |
| 16 | BA | DMA/50% BA | 12.5 | 12.5 | |
| 17 | BA | DMA/65% BA | 12.5 | 12.9 | |
| 18 | BA | DMA/80% BA | 12.5 | 13.3 | |

Block A describes the monomer(s) used in the synthesis of the $1^{st}$ block. Block B describes the primary monomer used in the $2^{nd}$ block synthesis and as described in the synthesis examples below, the endblock may or may not contain some level of monomer carryover from the $1^{st}$ block synthesis as well. In the event that a significant amount (>5 wt %) of carryover monomer exists in the B block, the wt % is denoted. The number average molecular weight (Mn) for the A and B blocks are denoted. The Mn values were calculated based on starting [M]/[I] ratios and monomer conversion data as measured by GC analysis. The abbreviation NM=not measured. The monomer abbreviations are: MA=methyl acrylate, BA=butyl acrylate, AA=acrylic acid, DMA=N,N dimethylacrylamide and PEGM=polyethyleneglycol methacrylate.

Synthesis Method A:

Synthesis method A is a method of preparing an AB block copolymers in which the residual monomers remaining after the $1^{st}$ block synthesis are removed (stripped under vacuum) prior to the endblock synthesis. A detailed example (example 1 of Table 1) of this synthesis method is described below.

Example 1

A living first block of poly(methyl acrylate) was prepared using the alkoxyamine BlocBuilder (iBA-DEPN). 32.2 g of iBA-DEPN (84.4 mmol) were added to 603 g of methyl acrylate (7.01 mol). The mixture was bubbled with nitrogen for 15 minutes before adding to a 1-L stainless steel reactor. The reactor was sealed and heated to 110° C. for 2 hours, at which point the methyl acrylate was 63% converted to polymer, corresponding to an Mn of 4.9 kg/mol. This mixture was then diluted with 300 g of butyl acrylate monomer and the residual methyl acrylate was stripped under vacuum at 50-60° C. The final composition was 5.4% MA, 28.5% BA, and 66% PMA.

37.94 g the above solution was added to a 250 ml polymerization vessel with 39.99 g additional butyl acrylate and 30.88 g of toluene. The mixture was heated to 110° C. for 3.5 hours to 76.2% conversion (MA and BA). Solvent and residual monomers were removed under vacuum at 110° C. resulting in a highly viscous liquid rubber.

Examples 2-9

Table 1

Each of these block copolymer examples is summarized in Table 1. The preparation of each composition was carried out using iBA-DEPN and using the analogous process as described in synthesis method A. For each example, the polymerization followed the protocol described in example 1 above. The first block was polymerized in either a solvent or neat between the temperatures of 100-120° C. dependant upon the targeted conversion and monomer types utilized. Typical conversions ranged from 60 to 90%, which normally took between 2-5 hours. In each case, after the targeted monomer conversion was reached, the excess monomer was removed under vacuum at a temperature below 80° C. The stripped first block was then further mixed with the second block monomer and optionally solvent. The second block was polymerized between 110-120° C. Typical conversions ranged from 60-90%. The block copolymers were subsequently isolated by drying under vacuum.

Synthesis Method B:

Synthesis method B is a method of preparing AB gradient block copolymers in which the residual monomers remaining after the 1$^{st}$ block synthesis are not removed prior to the endblock synthesis. Note that synthesis method A could also be used, with the exception that a monomer mix would be added for the second block polymerization step. A detailed example (example 10 of Table 1) of synthesis method B is described below.

Example 10

A living first block of poly(methyl acrylate) was prepared using the alkoxyamine BlocBuilder (iBA-DEPN). 7.5 g of iBA-DEPN (19.7 mmol) were added to 492 g of methyl acrylate (5.72 mol). The mixture was bubbled with nitrogen for 15 minutes before adding to a 1-L stainless steel reactor. The reactor was sealed and heated to 110° C. for 2.5 hours, at which point the methyl acrylate was 74% converted to polymer, corresponding to an Mn of 18.5 kg/mol. The residual MA monomer is not removed. To 100 g of the above solution, was added 254 g butyl acrylate and 102 g of toluene. The mixture was heated to ≈113° C. for 2 hours to 67% conversion (MA and BA). Solvent and residual monomers were removed under vacuum at 110° C. for 2 hours resulting in a highly viscous liquid rubber.

Examples 11-18

Table 1

Each of these block copolymer examples is summarized in Table 1. The preparation of each composition was carried out using iBA-DEPN and using the analogous process as described in synthesis method B. For each example, the polymerization followed the protocol described in example 10 above. The first block was polymerized in either a solvent or neat between the temperatures of 100-120° C. dependant upon the targeted conversion and monomer types utilized. Typical conversions ranged from 60 to 90%, which normally took between 2-5 hours. In each case, after the targeted monomer conversion was reached, the solution was used as is (excess monomer was not removed). The first block was then further mixed with the second block monomer and optionally solvent. The second block was polymerized between 110-120° C. Typical conversions ranged from 60-98%. The block copolymers were subsequently isolated by drying under vacuum. Note in sample 11 the monomer carried (BA) over is the same as the 2$^{nd}$ block monomer. In samples 13-18, additional 1$^{st}$ block monomer (BA) was added with the 2$^{nd}$ block comonomer (DMA).

Synthesis Method C.

Any of the above procedures can be followed by a reactive consumption (or "chase") of residual monomers using a typical free-radical initiator, such as an organic peroxide, azonitrile, or even by additional alkoxyamine.

Example 19

The synthesis is carried out as in example 1, except that prior to the removal of residuals, 0.37 grams of Luperox 531 is added to the reaction mixture (2 pph vs. monomer). The mixture is heated to 120° C. for 2 hours, until the amount of monomer total is less than 2000 ppm. This chasing step can be repeated to lower residual monomers further.

Example 20

The synthesis of a difunctional alkoxyamines to be used for the preparation of triblock copolymers is described below. The preparation of the bis-alkoxyamine: 47.0 grams (0.237 moles) of 1,4-butanediol diacrylate is mixed with 355.9 grams of absolute ethanol and bubbled with nitrogen for 10 minutes. The mixture is then added to 190.25 grams (0.499 moles) of iBA-DEPN initiator. The resulting solution is brought to reflux (78-80° C.) while stirring and held there for 4 hours to complete the reaction. NMR shows the reaction is >95% of the new dialkoxyamine. Therefore, the solution in ethanol is approximately 38% active. Starting from this dialkoxyamine instead of starting from BlocBuilder (iBA-DEPN), triblock copolymers can be synthesized using synthesis method A, B or C. In each case, the residual monomers can be chased or removed via devolatilization. Several triblock copolymer examples are listed below.

Example 20-A: PBA/DMA-b-PBA-b-PBA/DMA.
Example 20-B: PMA/DMA-PBA-PMA/DMA
Example 20-C: PMA-PBA-PMA
Example 20-D: PMA/PEGM-PBA-PMA/PEGM
Example 20-E: PBA/PEGM-PBA-PBA/PEGM
Example 20-F: PMA/AA-PBA-PMA/AA
Example 20-G: PBA/DMA/AA-PBA-PBA/DMA/AA Example 21

This example demonstrates a method to directly prepare an all-low Tg acrylic block copolymer of the current invention as a dilution in an epoxy resin. The polymerization of butyl acrylate is carried out using a mono-alkoxyamine and the standard polymerization conditions from example 9. After several hours, DMA and ethyl acetate is added to the polymerization mixture. The corresponding PBA-b-PBA/DMA polymer formed is diluted with epoxy resin and the residual monomer and solvent stripped leaving the block copolymer dissolved in epoxy resin. A chasing step can be performed in place of stripping, prior to the addition of the epoxy resin.

Example 22

To the diblock copolymers from 6-20, ½ molar equivalent of divinylbenzene is added and dissolved in DGEBA resin at <80° C. The solution is mixed and cured in application to crosslink the diblock copolymers but maintain the liquid state of the morphology.

Example 22-A: Same as in Example 22, but using butanediol dimethacrylate

Example 22-B: Same as in Example 22, but using butanediol diacrylate

Example 22-C: Same as in Example 22, but using triallylcyanurate

Example 23

A polymeric hardener is crated by reacting a block copolymer containing acid functionality with a primary amine, such as tert-butyl amine.

Example 24

Acid containing diblock copolymers, such as examples 4, 5, and 6 in Table 1 are neutralized with a quaternary ammonium hydroxide.

Use of Block copolymer in Epoxy. The Following products were used.

Epoxy Resin:

A bisphenol A diglycidyl ether (BADGE) with a molar mass of 382 g/mol, sold by the DOW Chemical company under the name of DER331 or A BADGE with a molar mass of 383 g/mol sold by the company Huntsman under the name of LY566.

Hardeners:

An amine hardener, dicyandiamide (DICY) sold by the company Air Products under the name Amicure 1200.

An amine hardener, which is an aromatic diamine, diaminodiphenyl sulphone (DDS) with a mass of 248 g/mol, sold by the company Aldrich.

Additives:

MDB2030: A diblock polymer consisting of a polymethyl acrylate block with 10% dimethylacrylamide and a polybutylacrylate block, the former having a molecular weight of 20 kg/mol, the latter having a molecular weight of 30 kg/mol (example 12 of Table 1).

MB2030: A diblock polymer consisting of a polymethyl acrylate block and a polybutylacrylate block, the former having a molecular weight of 20 kg/mol, the latter having a molecular weight of 30 kg/mol (example 3 of Table 1).

BDB1212: A diblock polymer consisting of a random mixture of 50% butyl acrylate and 50% dimethylacrylamide block and a polybutylacrylate block, the former having a molecular weight of 12 kg/mol, the latter having a molecular weight of 12 kg/mol (example 16 of Table 1).

MAM: A triblock polymer containing two methylmethacrylate blocks surrounding a butyl acrylate block with both MMA blocks having a molecular weight of 27.5 kg/mol and the butyl acrylate block having a molecular weight of 55 kg/mol.

CTBN: Carboxy terminated butadiene acrylonitrile: random copolymer of butadiene and acrylonitrile used in adduct form in epoxy resin under the trade name EPON 58005.

PEOPBO: An experimental diblock consisting of a block of polyethylene epoxide and a block of Polybutylene oxide Curing Conditions:

Using the hardener DICY: The blends comprising of 10% additive were cured at 190° C. for 70 minutes.

Using the hardener DDS, the blends comprising of 10% additive were cured for 2 h at 150° C. followed by a post cure for 3 h at 220° C.

Measurements:

The ability of the additive to toughen the material was measured by K1C. K1C was measured at room temperature on notched three point bending samples according to the procedure provided by ASTM. The test specimens are prenotched with a diamond saw. A finer crack is produced on the samples, clamped in a vice, using a razor blade, the razor blade being given a gentle tap which leads to cracking. The makes it possible to obtain a very fine crack root, similar to a natural crack.

The glass transition temperature of the material was measured by Dynamic Mechanical Analysis on cured samples using a Rheometrics Scientific RDA-111 strain rheometer. The rheometer was installed with a torsion rectangular geometry with approximate dimensions of 2''' 0.5''' ¼". Dynamic temperature ramp experiments were done at a frequency of 1 Hz and heating rate of 2 deg. C./min. All experiments were performed under nitrogen atmosphere. The glass transition temperature is taken at the maximum of tan δ.

Viscosity was measured in the modified epoxy resin (before addition of curative) on an ARES-F strain rheometer installed with 40 mm parallel plate geometry. Dynamic temperature ramp experiments were conducted at frequency 1 Hz from 20° C. to 120° C. at 3 deg. C./min.

Example 25

According to Invention

Figure 2:
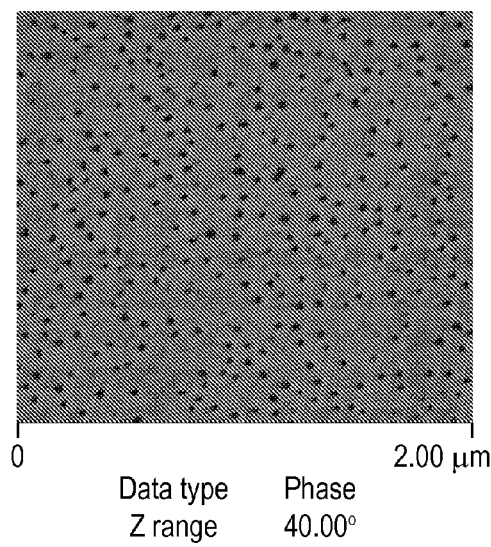

The use of MDB2030 with the resin DER331 and the hardener DICY. Procedure used as outlined above. Results in Table 2. AFM image in FIGS. 1 and 2.

Example 26

Figure 3:
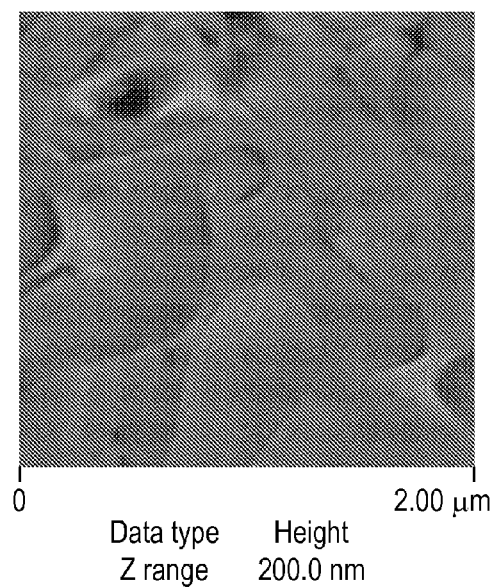
FIGS. 3 and 4: Are Atomic Force Microscopy (AFM) micrographs of a modified epoxy (Example 26), showing a continuous phase morphology.
Figure 4:
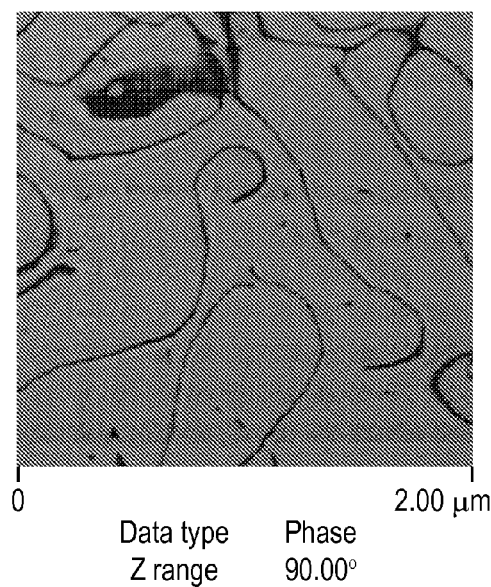

According to Invention the use of MB2030 with resin DER 331 and hardener DICY. Procedure used as outlined above. Results in Table 2. AFM image in FIGS. 3 and 4.

Example 27

Comparative

The use of MAM with the resin DER331 and the hardener DICY. Procedure used as outlined above. Results in Table 2.

Example 28

Comparative

The use of CTBN (EPON 58005) with the resin DER331 and the hardener DICY. Procedure used as outlined above. Results in Table 2.

Example 29

According to Invention

The use of BDB1212 with the resin LY566 and the hardener DDS. Procedure used as outlined above. Results in Table 3.

Example 30

Comparative

The use of MAM with the resin LY566 and the hardener DDS. Procedure used as outlined above. Results in Table 3.

Example 31

Comparative

The use of PEOPBO with the resin LY566 and the hardener DDS. Procedure used as outlined above. Results in Table 3.

TABLE 2

| Example # | Nature of Resin-Hardener | Nature of toughening agent | K1C | Tg |
|---|---|---|---|---|
| 25 | BADGE-DICY | PBA-b-PMA/DMA | 1.54 | 138.6 |
| 26 | BADGE-DICY | PBA-b-PMA | 1.21 | 144.4 |
| 27 | BADGE-DICY | MAM | 1.35 | 144.3 |
| 28 | BADGE-DICY | CTBN | 1.62 | 129.2 |

Reference: The unmodified BADGE-DICY system has a K1C of 0.88 and a Tg of 148.1
Note:
In examples 25 and 26, it can be seen how the structure and subsequent toughening properties can be tailored by simply modifying the solubility and/or segregation strength of the block copolymer of the current invention. In example 25, with the addition of 10% of a highly epoxy miscible block containing DMA, the DMA increases the compatibility and the block segregation strength with the BADGE-DICY matrix leading to nanostructuration into the observed discrete rubber domains. This morphology increases the toughness significantly. When the DMA is removed, making the block less strongly segregated (example 26), the nanostructuration is changed to a continuous phasemorphology. This imparts less of a toughening effect, but greatly flexibilizes the thermoset by greatly decreasing the modulus, without a drop in the thermoset Tg.

In comparing examples 25 and 27, the low Tg acrylic block copolymer outperforms the MAM in terms of K1C.

In comparing examples 25 and 28, the CTBN has a slight advantage over the low Tg acrylic block copolymer in K1C, but suffers a 9° C. lower Tg. The acrylic diblock maintains the best balance of properties.

TABLE 3

| Example # | Nature of Resin-Hardener | Nature of toughening agent | K1C | Observations |
|---|---|---|---|---|
| 29 | BADGE-DDS | PBA-b-PBA/DMA | 1.02 | Compatible |
| 30 | BADGE-DDS | MAM | | Complete phase separation |
| 31 | BADGE-DDS | PEO-b-PBO | 0.8 | Partial phase separation |

Reference: The unmodified BADGE-DDS system has a K1C of 0.82.
Note:
In comparing examples 29, 30 and 31, by tailoring of monomer composition by including a highly epoxy miscible monomer, DMA, good compatibility and the highest K1C can be achieved with the low Tg acrylic block copolymer.

Viscosity Measurement

Example 32

According to Invention

The use of MDB2030 at 10% (by weight loading) with the resin DER331.

Example 33

According to Invention

The use of MB2030 at 10% (by weight loading) with the resin DER331.

Example 34

According to Invention

The use of BDB1212 at 10% (by weight loading) with the resin DER331.

Example 35

Comparative

The use of MAM at 10% (by weight loading) with the resin DER331.

TABLE 4

| Example # | Resin | Nature of toughening agent | Viscosity (Pa · s) at 25° C. | Viscosity (Pa · s) at 40° C. |
|---|---|---|---|---|
| 32 | BADGE | PBA-b-PMA/DMA | 102.9 | 13.35 |
| 33 | BADGE | PBA-b-PMA | 91.1 | 13.57 |
| 34 | BADGE | PBA-b-DMA/PBA | 64.2 | 8.97 |
| 35 | BADGE | MAM | 344.5 | 60.67 |

Note:
In comparing examples 32, 33, 34 and 35, by using a low Tg epoxy miscible block significant (3-7X) reductions in viscosity are achieved as compared to the MAM block copolymer with PMMA epoxy miscible blocks.

What is claimed is:

1. A block copolymer consisting of all low Tg acrylic blocks, having Tg's of below 35° C., wherein said copolymer comprises at least one thermoset compatible block, wherein said thermoset compatible block(s) comprise one or more monomer units selected from the group consisting of polymethyl acrylate, polymethyl acrylate-co-N,N dimethylacrylamide, polymethyl acrylate-co-acrylic acid, polymethyl acrylate-co-polyethyleneglycol methacrylate, polybutyl acrylate-co-N,N dimethylacrylamide, and polybutyl acrylate-co-polyethyleneglycol methacrylate.

2. The block copolymer of claim 1, comprising at least one thermoset compatible block and at least one gradient block, wherein said thermoset compatible block and gradient block can be the same or different blocks.

3. The block copolymer of claim 1, wherein at least one thermoset compatible block contains from 0.5 to 15 mol percent functionalization.

4. The block copolymer of claim 1, wherein said at least one thermoset compatible block comprises polymethyl acrylate, polymethyl acrylate-co-N,N-dimethylacrylamide, polymethyl acrylate-co-acrylic acid or polymethyl acrylate-co-polyethyleneglycol methacrylate.

5. The block copolymer of claim 1, wherein said at least one thermoset compatible block comprises a random copolymer comprising N,N-dimethylacrylamide monomer units and at least one other low Tg acrylate monomer.

6. The block copolymer of claim 1, wherein said low Tg acrylic blocks contain 100% (meth)acrylic monomer units.

7. The block copolymer of claim 1, wherein said block copolymer is formed by a controlled radical polymerization (CRP) process.

8. The block copolymer of claim 1, wherein said block copolymer comprises a thermoset compatible segment of polybutyl acrylate-co-N,N-dimethylacrylamide and further comprises an incompatible block of poly(butylacrylate).

9. A thermoset composition comprising:
   a) a thermoset polymer resin matrix, and
   b) the block copolymer of claim 1.

10. The thermoset composition of claim 9, wherein the thermoset polymer resin is an epoxy resin.

11. The thermoset composition of claim 9, wherein the thermoset composition is an epoxy resin and the all low Tg acrylic based block copolymer comprises at least 1 gradient block.

12. The thermoset composition of claim 9, wherein the all acrylic block copolymer forms discrete rubber particle morphology leading to a toughened thermoset as measured by an increase in K1C as compared to the unmodified thermoset and wherein the Tg of the thermoset composition is less than 15° C. lower than that of the unmodified thermoset resin.

13. The thermoset composition of claim 9, wherein the all acrylic block copolymer forms a continuous phase wherein the modulus of the thermoset composition is at least 25 percent lower than that of the unmodified thermoset resin, and the Tg of the thermoset composition is less than 15° C. lower than that of the unmodified thermoset resin.

14. The thermoset composition of claim 9 comprising a copper clad laminate for flexible printed wire boards, coatings, or structural adhesives.

\* \* \* \* \*